(12) United States Patent
Koike (10) Patent No.: US 7,268,068 B2
(45) Date of Patent: Sep. 11, 2007

(54) SEMICONDUCTOR DEVICE AND MANUFACTURING METHOD THEREOF

(75) Inventor: Hidetoshi Koike, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 356 days.

(21) Appl. No.: 11/078,031

(22) Filed: Mar. 11, 2005

(65) Prior Publication Data

US 2005/0170635 A1    Aug. 4, 2005

Related U.S. Application Data

(62) Division of application No. 09/953,345, filed on Sep. 13, 2001, now Pat. No. 6,989,577.

(30) Foreign Application Priority Data

Sep. 14, 2000 (JP) ............................... 2000-279591

(51) Int. Cl.
H01L 21/4763 (2006.01)
H01L 21/82 (2006.01)
H01L 21/44 (2006.01)
H01L 21/8238 (2006.01)
H01L 21/326 (2006.01)

(52) U.S. Cl. ............... 438/622; 438/132; 438/215; 438/333; 438/467; 438/601

(58) Field of Classification Search ............... 438/622, 438/601, 132, 333, 215, 467
See application file for complete search history.

(56) References Cited

U.S. PATENT DOCUMENTS

| | | | |
|---|---|---|---|
| 6,046,488 A | 4/2000 | Kawasaki et al. | .......... 257/529 |
| 6,136,708 A | 10/2000 | Aoki | |
| 6,372,354 B1* | 4/2002 | Park et al. | .................. 428/447 |
| 6,444,544 B1* | 9/2002 | Hu et al. | .................... 438/467 |
| 6,867,441 B1* | 3/2005 | Yang et al. | ................. 257/209 |
| 2005/0116333 A1* | 6/2005 | Akiyama | .................... 257/698 |

FOREIGN PATENT DOCUMENTS

| | | |
|---|---|---|
| JP | 05-218205 | 8/1993 |
| JP | 07-037988 | 2/1995 |

(Continued)

OTHER PUBLICATIONS

U.S. Appl. No. 09/604,791, filed Jun. 28, 2000.

(Continued)

*Primary Examiner*—Walter Lindsay, Jr.
(74) *Attorney, Agent, or Firm*—Hogan & Hartson LLP (57) ABSTRACT

A semiconductor device comprises a multiple insulation layer structure in which multiple insulation layers each having interconnection layer are built up and either one of the interconnection layer forming a fuse is blown in order to select a spare cell to relieve a defective cell; and an opening area corresponding to said fuse, the opening being formed on one or more insulation layers disposed above the layer which includes the fuse, wherein a side wall position corresponding to the opening of the first protective insulation film formed on the top layer of the multiple layers and a side wall position corresponding to the opening of the second protective insulation film formed on the first protective insulation film are continuous at the boundary thereof.

4 Claims, 7 Drawing Sheets

FOREIGN PATENT DOCUMENTS

| | | |
|---|---|---|
| JP | 11-008305 | 1/1999 |
| JP | 11-111847 | 4/1999 |
| JP | 11-21489 | 8/1999 |
| JP | 11-224900 | 8/1999 |
| JP | 2000-150640 | 5/2000 |
| JP | 2000-208620 | 7/2000 |
| JP | 2000-332114 | 11/2000 |

OTHER PUBLICATIONS

U.S. Appl. No. 09/411,590, filed Oct. 4, 1999.

* cited by examiner

SEMICONDUCTOR DEVICE AND MANUFACTURING METHOD THEREOF

This is a divisional of application Ser. No. 09/953,345 filed Sep. 13, 2001, now U.S. Pat. No. 6,989,577, which application is hereby incorporated by reference in its entirety.

CROSS REFERENCE TO RELATED APPLICATION

This application is based upon and claims the benefit of priority from the prior Japanese Patent Applications No. 2000-279591, filed on Sep. 14, 2000; the entire contents of which are incorporated herein by reference.

BACKGROUND OF THE INVENTION

The present invention relates to a semiconductor device and its manufacturing method, especially to a semiconductor device having a circuit to relieve a defect using copper interconnection and a method for manufacturing the device.

In semiconductor devices, copper (Cu) interconnection is widely adopted in order to reduce signal delay in interconnections by lowering resistance in interconnections and to increase electromigration resistance. Especially, copper interconnection is becoming a mainstream in high performance logic LSI.

On the other hand, in LSIs having memories therein in mixed manner, the adoption of redundancy construction having built-in defect relieving circuit in order to increase process yield become common technology. In the redundancy construction, a spare cell is used by replacing a defective cell found.

It is a common technique in which a defective cell address is stored in a tester when a defective cell is found by the tester, then, a fuse formed by a metal interconnection layer such as Al or Cu is blown by laser light in order to select a spare cell instead of a defective cell.

The metal fuse usually employs a metal interconnection layer which is by one layer below the top metal interconnection layer. This is because the top layer is not necessarily protected enough and has a problem about reliability that metal is degraded by the contact with external atmosphere, etc., and the top layer is not suited to be blown since the film thickness of the metal interconnection layer on the top layer is larger as it is often used as a power line.

Accordingly, in order to blow a metal fuse, it is required to remove the first protective insulating film such as interlayer insulating film and passivation film which exist above the metal fuse and are an obstacle for blowing a fuse. This process to remove a interlayer film and the first protective insulating film on a metal fuse is called "fuse window opening process".

The conventional window opening process will be explained using figures.

Figure 14:
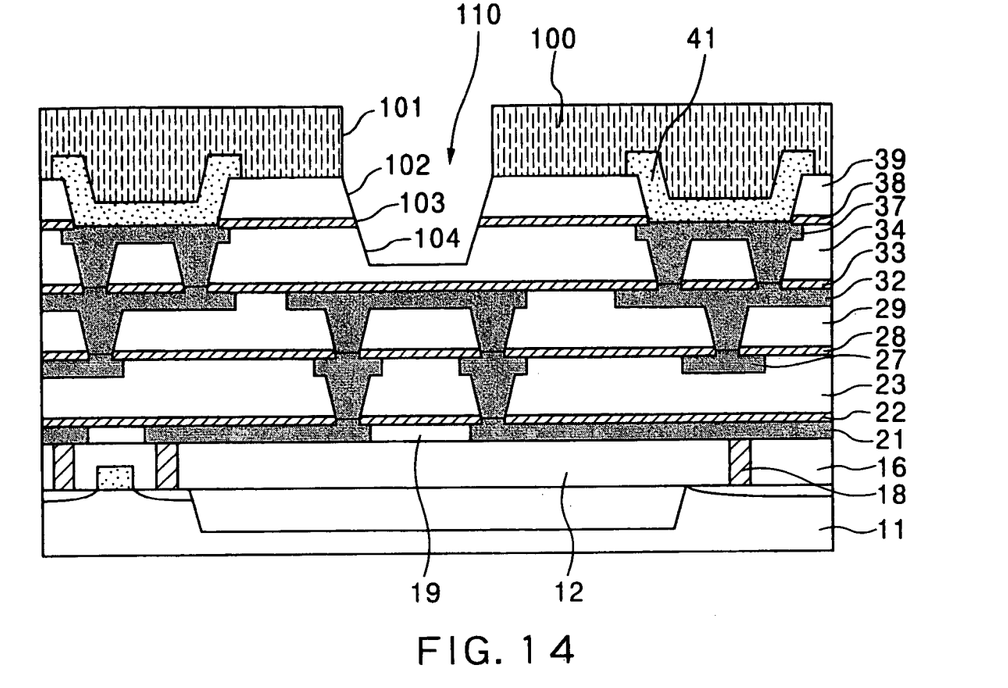
FIG. 14 is a cross section diagram of a device to show a step to open a fuse window in the conventional semiconductor device.
Figure 15:
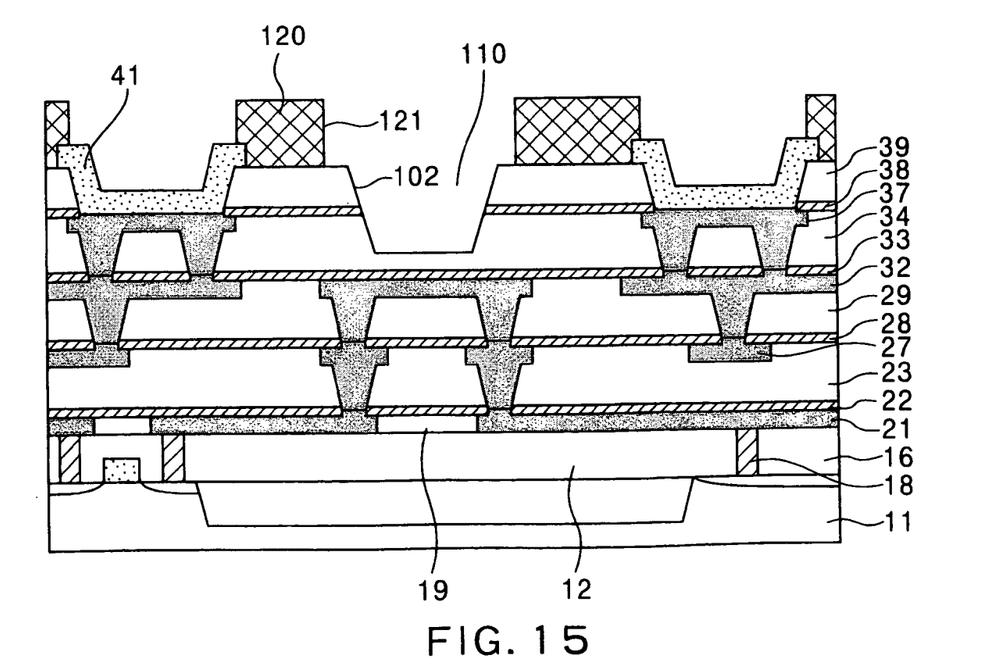
FIG. 15 is a cross section diagram of a device to show a follwing step process to open a fuse window in the conventional semiconductor device.

FIGS. 14 and 15 are the cross sectional views of the device showing conventional window opening process.

FIG. 14 is a sectional view of a conventional semiconductor device with four-layer interconnection. This is a four-layer interconnection structure where the first and second interlayer insulating film 16 and 19, the first interconnection layer 21, a silicon nitride film as an antioxidant film ($Si_3N_4$ film) 22, the third interlayer insulating film 23, the second interconnection layer 27, a silicon nitride film ($Si_3N_4$ film) 28, the fourth interlayer insulating film 29, the third interconnection layer 32, a silicon nitride film ($Si_3N_4$ film) 33, the fifth interlayer insulating film 34, the fourth interconnection layer 37, silicon nitride film ($Si_3N_4$ film) 38, etc are built up on the semiconductor substrate 11 where devices are formed. A bonding pad section 41 and a passivation film 39 are formed on the top layer.

Such semiconductor device is manufactured by the following process.

At first, in order to form a fuse window opening, photoresist 100 is applied to the whole part then patterning is performed by photo lithography so that the area except a fuse window opening is covered with the photoresist 100. A passivation film 39, a thin silicon nitride film 38 and the fifth interlayer insulating film 34 are etched in a method such as RIE (Reactive Ion Etching) using the resist 100 as an etching mask in order to open a fuse window 110. In this state, the positions of a side wall 101 of the resist 100 at the opening 110, a side wall 102 of the passivation film 39, a side wall 103 of the thin silicon nitride film 38 and a side wall 104 of the fifth interlayer insulating film 34 are continuous.

Finally, the resist 100 is removed and a polyimide film 120 as a surface protective film is formed on the passivation film 39 except a bonding pad section 41 and the fuse window 110. At this time, the positions of a side wall 121 of a polyimide film 120 and a side wall 102 of the passivation film 39 are not matched. This will occur a problem that the fuse window opening becomes narrower as explained later.

As shown above, according to the conventional art, in order to open a metal fuse window, a photolithography process should be performed in addition to the photolithography to make an opening for a bonding pad. So, the conventional art has a drawbacks such as increased number of process and higher cost.

SUMMARY OF THE INVENTION

A semiconductor device according to an embodiment of the present invention comprises:

a multiple insulation layer structure in which multiple insulation layers each having interconnection layer are built up and either one of the interconnection layer forming a fuse is blown in order to select a spare cell to relieve a defective cell; and an opening area corresponding to said fuse, said opening being formed on one or more insulation layers disposed above the layer which includes said fuse, wherein a side wall position corresponding to said opening of the first protective insulation film formed on the top layer of said multiple layers and a side wall position corresponding to said opening of the second protective insulation film formed on said first protective insulation film are continuous at the boundary thereof.

A method of manufacturing a semiconductor device according to an embodiment of the present invention comprises:

forming elements on a substrate;

forming stacked interconnection structure on said elements by sequentially forming interlayer insulating film, interconnection layer and antioxidant layer and repeating these forming at least two times;

forming a first protective insulating film on a top antioxidant layer;

removing said first protective insulating film and said top antioxidant layer at lead out region of a top interconnection layer to form a lead out opening;

forming a lead out electrode in said lead out opening;

forming a second protective insulating film having an opening on said first protective insulating film, said opening corresponding to a fuse portion in an interconnection layer below said top interconnection layer; and forming a window for fuse blowing by removing a part of said first protective insulating film, said top antioxidant layer and said interlayer insulating film using said second protective insulating film as a mask.

A method for manufacturing a semiconductor device according to another embodiment of the present invention comprises:

forming elements on a substrate;

forming stacked interconnection structure on said elements by sequentially forming interlayer insulating film, interconnection layer and antioxidant layer and repeating these forming at least two times;

forming a first protective insulating film on a top antioxidant layer;

removing said first protective insulating film and said top antioxidant layer at lead out region of a top interconnection region and fuse blowing region of a top interconnection layer to form a interconnection lead out opening and a fuse blowing opening;

forming a lead out electrode in said lead out opeing;

forming a second protective insulating film having an opening on said first protective insulating film, said opening corresponding to a said fuse blowing opening; and forming a window for fuse blowing by removing a part of said interlayer insulating film using said second protective insulating film as a mask.

DETAILED DESCRIPTION OF THE INVENTION

A semiconductor device and a method for manufacturing the semiconductor device according to the present invention will now be explained in detail referring to drawings. The examples which are explained herein are the embodiments adopted for LSI having four-layer Cu interconnection.

FIGS. 1 to 9 are cross section diagrams of process steps showing a manufacturing method of a semiconductor device according to the first embodiment of the present invention.

Figure 1:
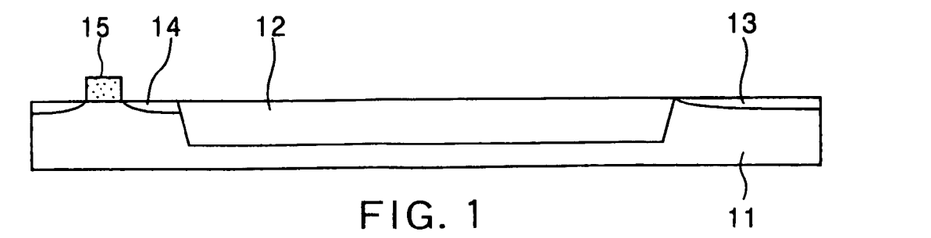
FIG. 1 is a cross section diagram showing a first step of a method of manufacturing semiconductor device according to a first embodiment of the present invention.

At first, as shown in FIG. 1, a device isolation area 12 is formed in a surface part of a silicon substrate 11 using the ordinal Shallow Trench Isolation (STI) technology. Then, a diffusion region 13 which will be a passive device such as capacitor and an active elements such as MOSFET having a source and drain diffusion regions 14 and a gate 15 is formed in a device area which is surrounded by the device isolation region.

Figure 2:
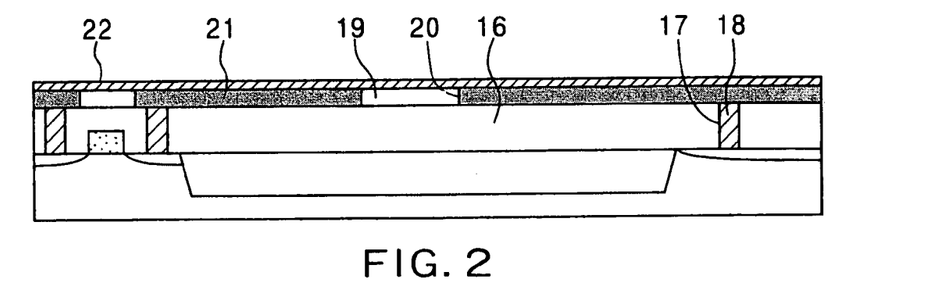
FIG. 2 is a cross section diagram showing a second step of a method of manufacturing semiconductor device according to the first embodiment of the present invention.

Then, as shown in FIG. 2, the first interlayer insulating film 16 such as BPSG film is deposited on the whole surface and the surface is flattened with CMP method. After that, a first contact hole 17 is opened with photo lithography method and a contact 18 is formed by filling the contact hole 17 with tungsten. Thereafter, a second interlayer insulating film 19 such as $SiO_2$ film is deposited on the whole surface of them shown above. The first interconnection forming area is removed by the photo lithography method and a first interconnection trench 20 is formed in the second layer insulating film. Subsequently, copper is deposited on the whole surface and it is flattened by CMP method to make a first interconnection layer 21 remained in the first interconnection trench 20. At this moment, a thin silicon nitride film 22 is deposited on the whole surface in order to prevent oxidation and diffusion as copper is liable to be oxidized. The process shown above is called "single damascene process" of copper interconnection.

Figure 3:
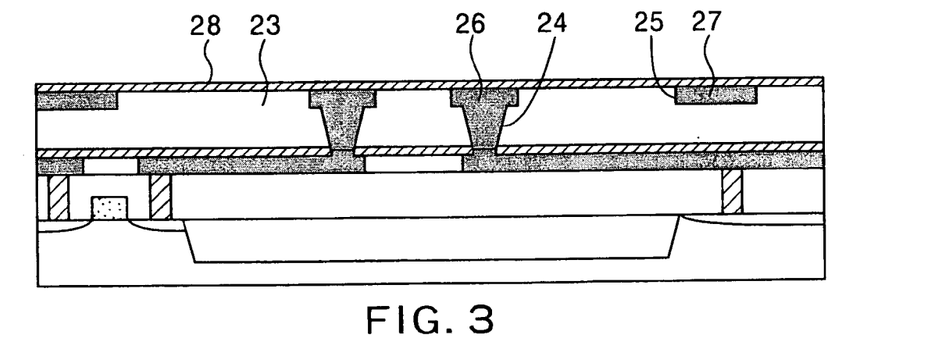
FIG. 3 is a cross section diagram showing a third step of a method of manufacturing semiconductor device according to the first embodiment of the present invention.

Then, as shown in FIG. 3, a third interlayer insulating film 23 such as $SiO_2$ film is deposited on the whole surface and a second contact hole 24 is opened with photo lithography method in order to connect it to the first interconnection layer 21. Subsequently, the second interconnection forming region on the third interlayer insulating film 23 is removed to form a second interconnection trench 25 using photo lithography method. Then, copper is deposited on the whole surface and is flattened by CMP method to make a second second contact 26 in the second contact hole 24 and an interconnection layer 27 remained in the second interconnection trench 25, respectively. Then, as the case of the first layer, a thin silicon nitride film ($Si_3N_4$ film, the same hereafter) 28 is deposited on the whole surface in order to prevent oxidation and diffusion of copper. The process shown above is called "dual damascene process" of copper interconnection.

Figure 4:
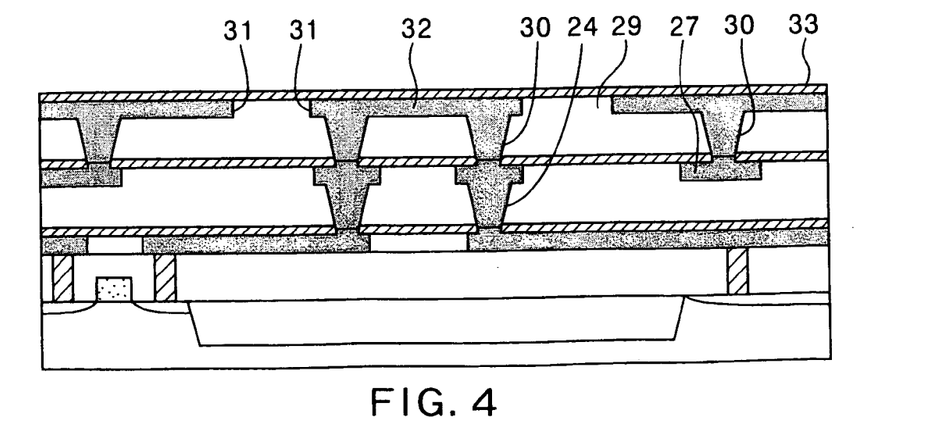
FIG. 4 is a cross section diagram showing a 4th step of a method of manufacturing semiconductor device according to the first embodiment of the present invention.

Then, as shown in FIG. 4, a fourth interlayer insulating film 29 such as SiO₂ film is deposited on the whole surface and the third contact hole 30 is opened with photo lithography method in order to connect it to the second contact hole 24 and the second contact 27. Subsequently, the third interconnection forming region on the fourth interlayer insulating film 29 is removed to form a third interconnection trench 31 using photo lithography method. Then, copper is deposited on the whole surface and is flattened by CMP method to make a third interconnection layer 32 remained in the third contact hole 30 and the third interconnection trench 31. Then, as the case of other layers, a thin silicon nitride film 33 is deposited on the whole surface in order to prevent oxidation and diffusion of copper. In the case of a copper interconnection with the four-layer structure, a metal fuse is formed as a third interconnection layer 32 which connects two contact holes in the center of FIG. 4.

Figure 5:
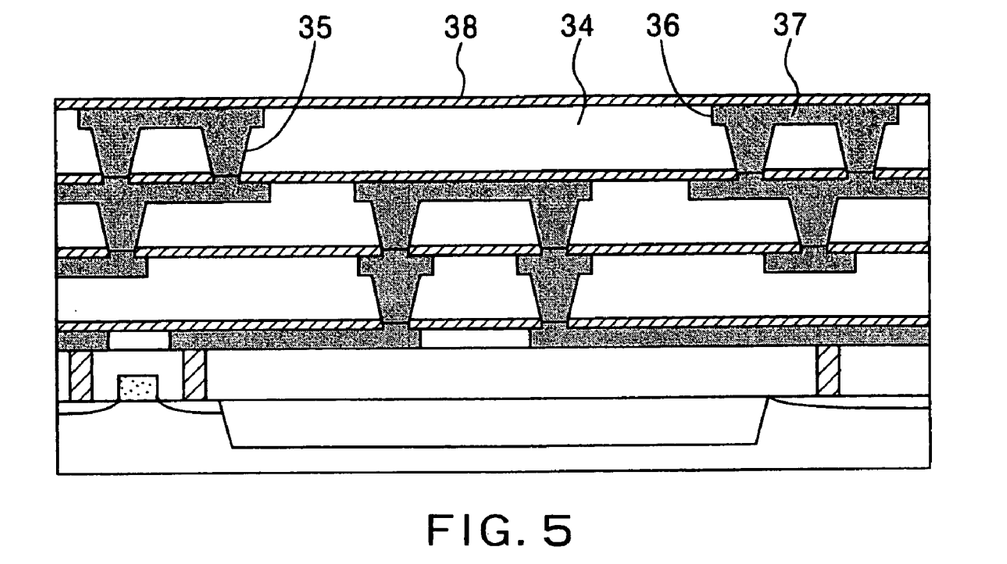
FIG. 5 is a cross section diagram showing a 5th step of a method of manufacturing semiconductor device according to the first embodiment of the present invention.

Then, as shown in FIG. 5, a fifth interlayer insulating film 34 such as SiO₂ film is deposited and a fourth contact hole 35 is opened with photo lithography method. Subsequently, the fourth interconnection trench 36 is patterned into the specified configuration with photo lithography method. After that, copper is deposited on the whole surface and is flattened by CMP method to make a fourth interconnection layer 37 is remained in the fourth contact hole 35 and in the fourth interconnection trench 36. Then, as the case of other layers, a thin silicon nitride film 38 is deposited in order to prevent oxidation and diffusion of copper.

Figure 6:
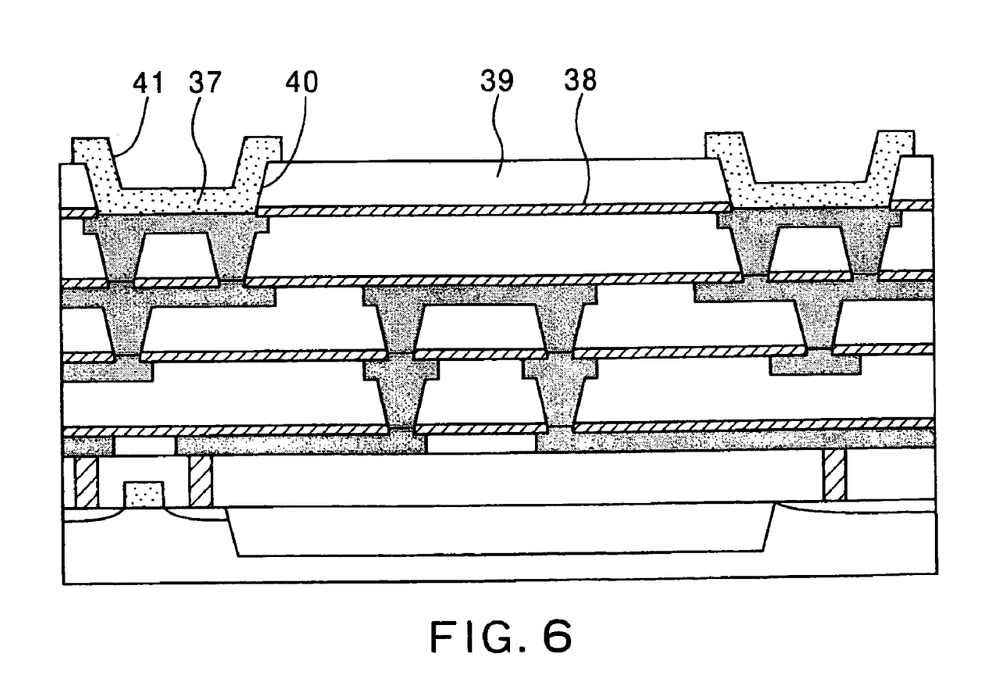
FIG. 6 is a cross section diagram showing a 6th step of a method of manufacturing semiconductor device according to the first embodiment of the present invention.

Then, as shown in FIG. 6, a passivation film 39 such as PSG film is deposited and an opening is formed by etching the passivation film 39 and a thin silicon nitride film 38 on the fourth interconnection layer 37 to be a bonding pad to remove them and form an opening 40 to expose the fourth interconnection layer 37. A bonding pad 41 is formed at the opening 40 by depositing aluminum on the whole surface and performing a patterning into the specified configuration with photo lithography method.

The fuse window opening process according to the present invention applied to the LSI with four layer copper interconnection as shown above will now be explained referring to FIGS. 7 to 9.

Figure 7:
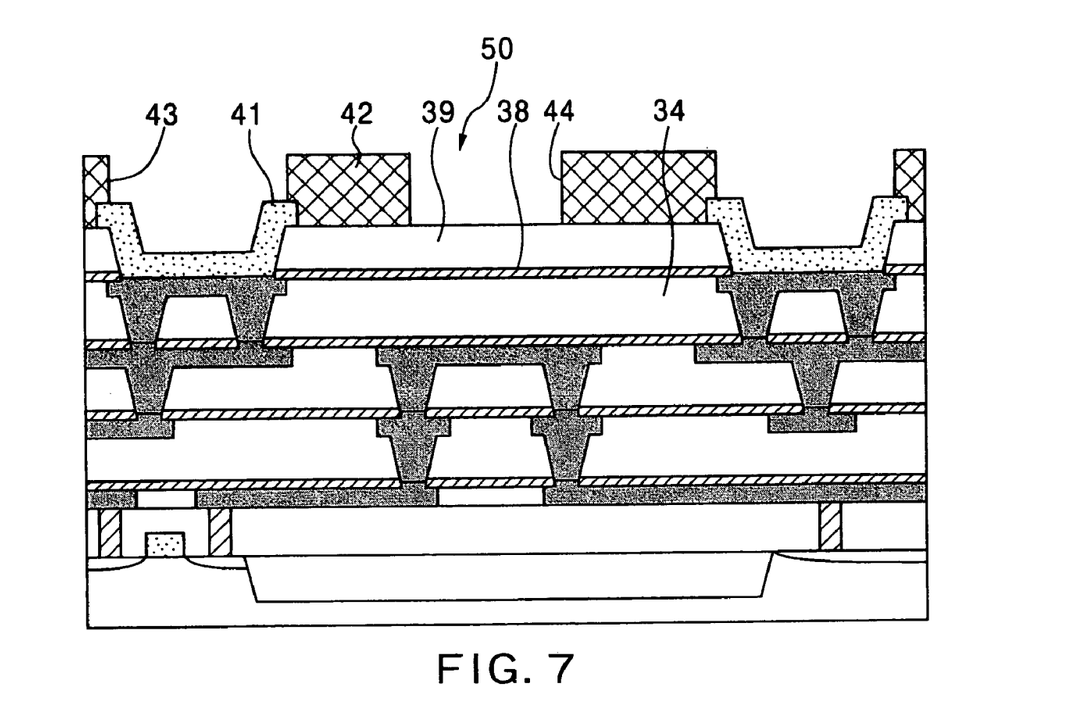
FIG. 7 is a cross section diagram showing a 7th step of a method of manufacturing semiconductor device according to the first embodiment of the present invention.

As shown in FIG. 7, polyimide resin film 42 is selectively formed to protect the surface. Openings 43 and 44 of the polyimide resin film 42 are formed on a part of the bonding pad 41 and fuse window opening 50, respectively. This shape of polyimide resin film 42 is obtained by a method where lithography is performed by application in spin coating method, a method where exposure is performed by applying photosensitive polyimide or a method where a screen printing is performed.

Figure 8:
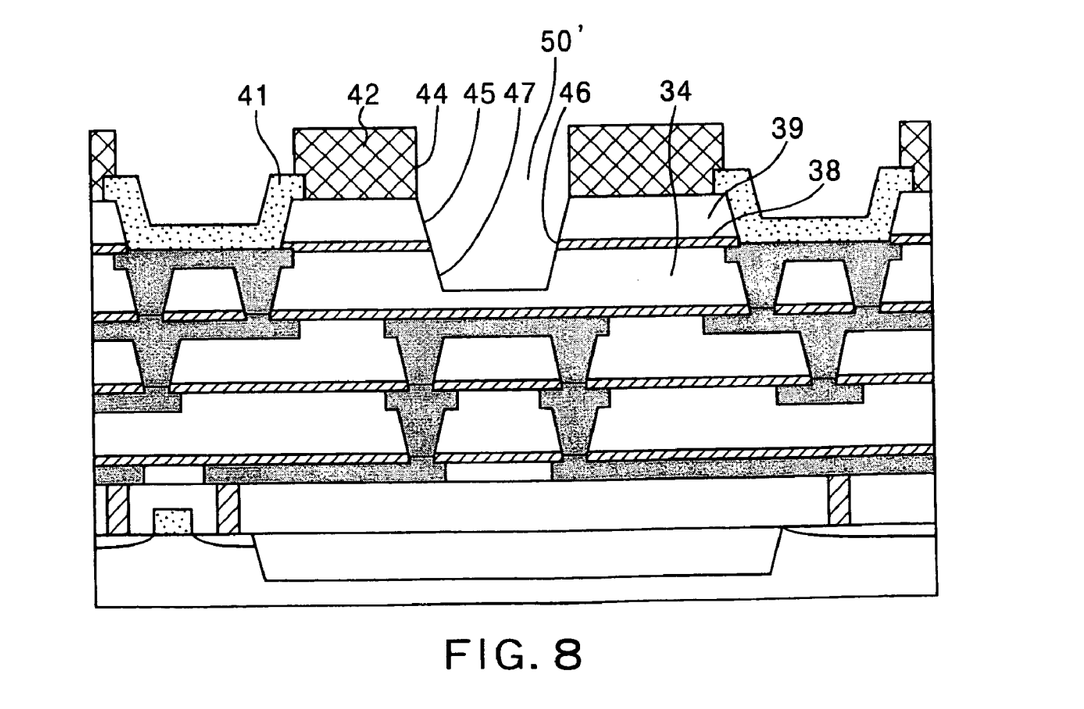
FIG. 8 is a cross section diagram showing a 8th step of a method of manufacturing semiconductor device according to the first embodiment of the present invention

Then, as shown in FIG. 8, the passivation film 39, the thin silicon nitride film 38 and the fifth interlayer insulating film 34 are removed to form a window opening 50' by performing anisotropic etching such as RIE using the polyimide resin film 42 as a mask. Their side walls 45, 46, 47 have no gap and are continuous with the opening side wall 44 of the polyimide resin film 42.

In the process to open the window according to an embodiment of the prevent invention, the passivation film 39, the thin silicon nitride film 38 and the fifth interlayer insulating film 34 are etched simultaneously using the polyimide resin film 42 as a mask. Therefore, it is not required to add one time of photo lithography step to open a window for metal fusing in addition to opening a bonding pad as the conventional art. Thus, the process is simplified and the cost is reduced.

Figure 9:
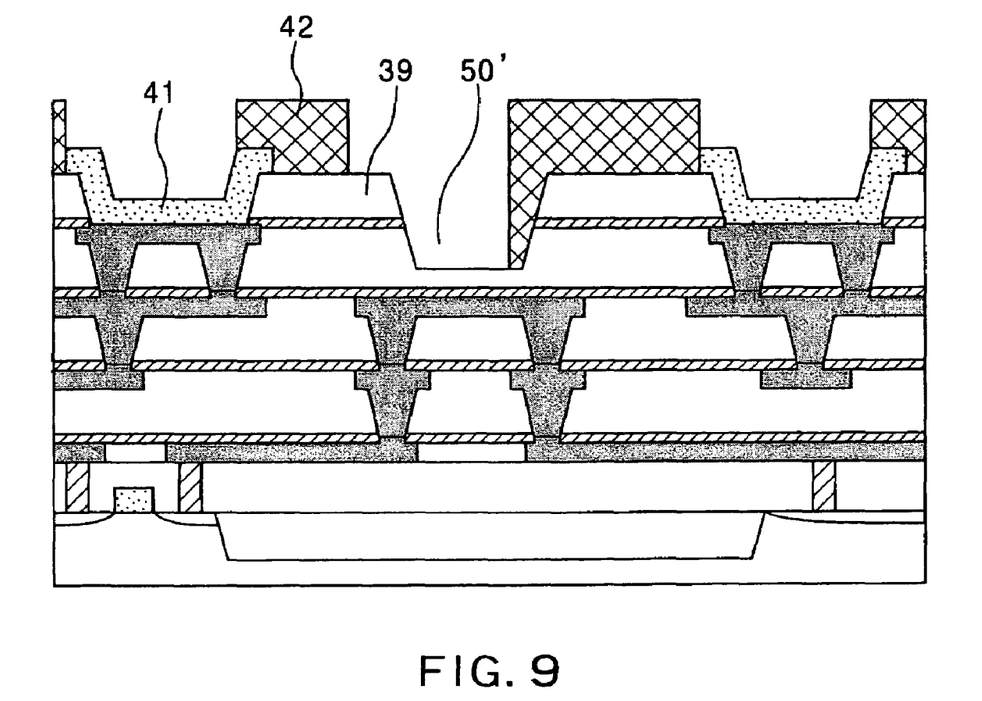
FIG. 9 is a cross section diagram to explain a defect which does not occur with the method of manufacturing semiconductor device according to embodiments of the present invention.

Also according to the embodiment of the present invention, when performing a process to open a fuse window, a polyimide resin film to protect the surface is also used as a mask. If a window opening is formed in a separate process and a protective film of polyimide is formed after that, there may occur a problem that the polyimide resin film 42 protrudes into the window opening 50' due to the misalignment of the polyimide resin film 42 as shown in FIG. 9 and the window opening 50' becomes narrower. The problem can be solved by the present invention.

Further, the polyimide resin film releases the stress generated in the layer below to prevent generation of varied defects effectively.

FIGS. 10 to 13 are cross section diagrams by process showing a manufacturing method of a semiconductor device according to a second embodiment of the present invention.

Figure 10:
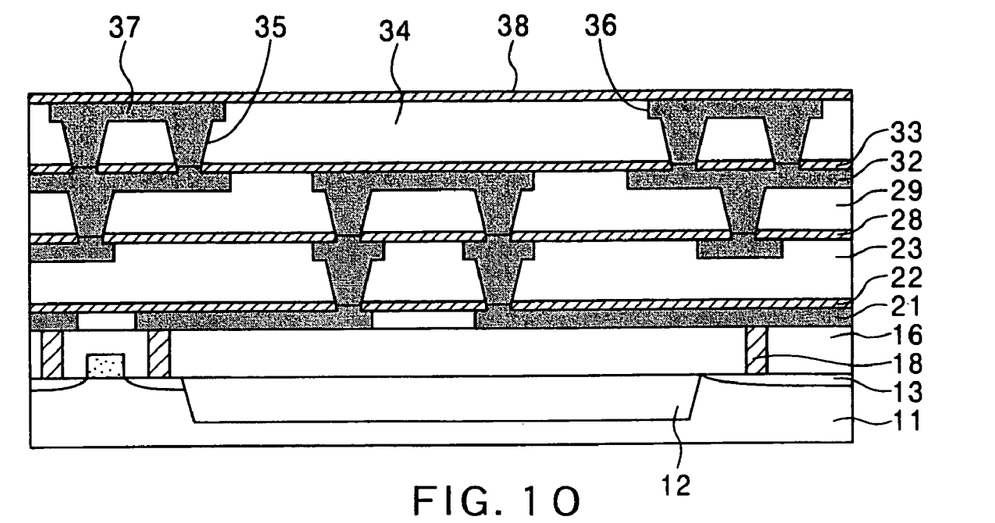
FIG. 10 is a cross section diagram showing a first step to open a fuse window according to the second embodiment of the present invention.

FIG. 10 is exactly the same as FIG. 5 according to the first embodiment of the invention. In the following description, common reference numbers are used for the same elements between them.

Figure 11:
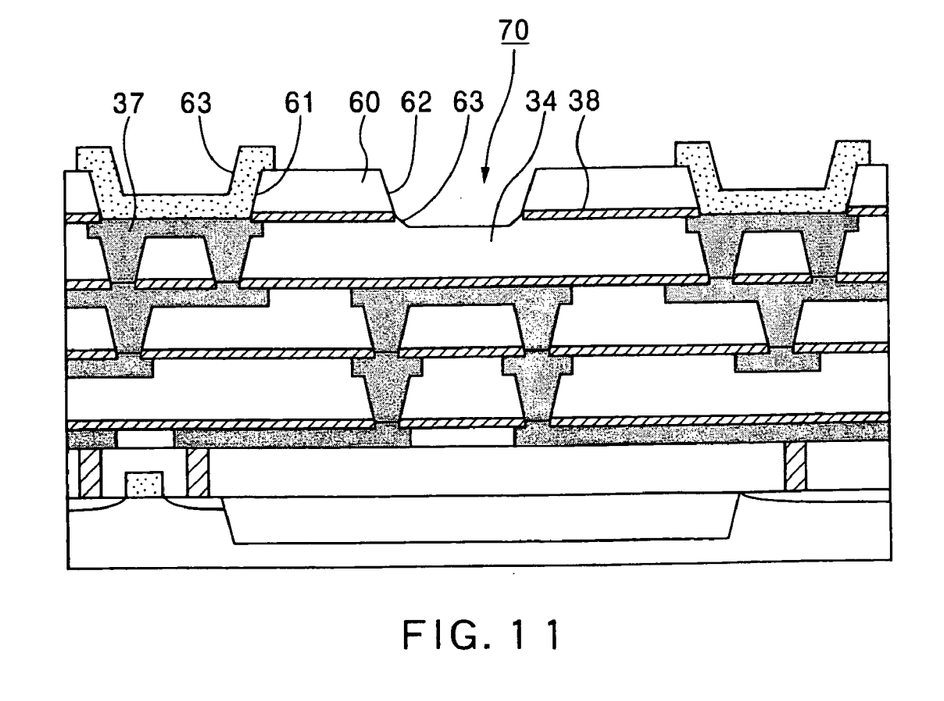
FIG. 11 is a cross section diagram showing a second step to open a fuse window according to the second embodiment of the present invention.

As shown in FIG. 11, a passivation film 60 such as PSG film is deposited and the passivation film on the fourth interconnection layer 37 to be a bonding pad and the passivation film at the fuse window opening 70 are etched with photo lithography method to form openings 61 and 62 respectively. At this time, the thin silicon nitride film 38 is also etched at the area, the fourth copper interconnection 37 is exposed at the bonding pad forming area and the a part 63 of the surface of the fifth interlayer insulating film 34 is etched at the fuse window opening.

After that, a bonding pad 63 is formed by depositing aluminum and reserving it in the specified shape at the bonding pad forming area with photo lithography method.

Figure 12:
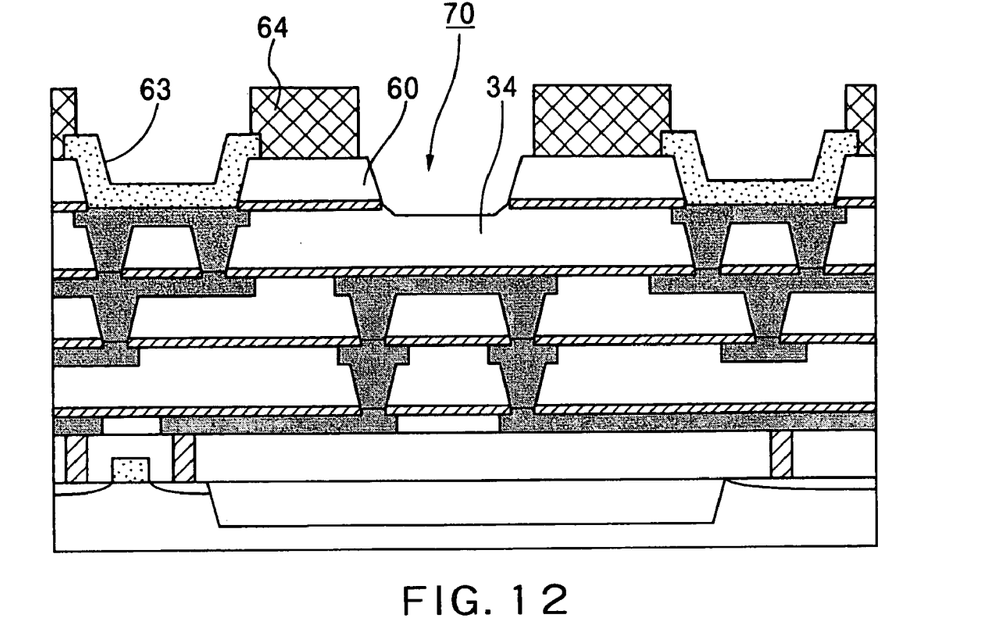
FIG. 12 is a cross section diagram showing a third step to open a fuse window according to the second embodiment of the present invention.

Then, as shown in FIG. 12, a polyimide resin film 64 is formed to protect the surface. The polyimide resin film 64 is formed selectively on the area except the bonding pad 63 and the fuse window opening 70 by the method shown above.

Figure 13:
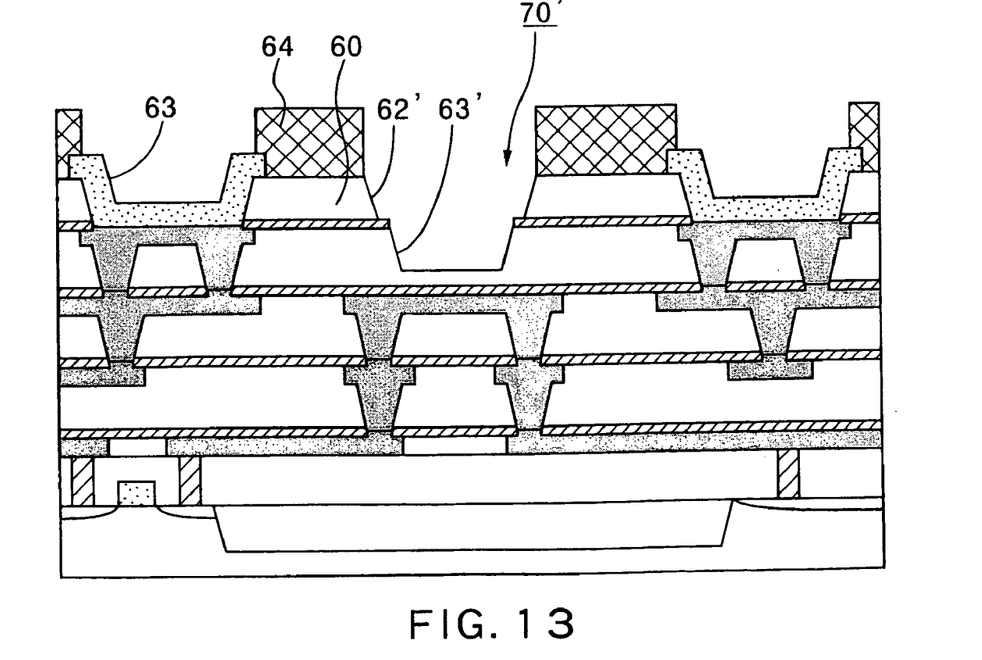
FIG. 13 is a cross section diagram showing a fourth step to open a fuse window according to the second embodiment of the present invention.

Then, as shown in FIG. 13, the fifth interlayer insulating film 34 are etched in the method such as RIE using the polyimide resin film 64 as an etching mask in order to open a fuse window 70'. By the etching, the side wall 62' of the window opening of the passivation film 60 is wider than that of FIG. 11 and the side wall 63' of the fifth interlayer insulating film 33 is also deeper and wider than that of FIG. 11.

In this embodiment, the fuse opening process is performed in such a way that the second protective insulating film is formed on the first protective insulating film in accordance with the opening of the first protective insulating film whose opening is formed in accordance with the fuse opening area in advance. Therefore, it is not required to add a photo lithography step to open a fuse window. Thus, the process is simplified and the cost is reduced. Further, the polyimide resin film modifies the stress generated in the layer positioned below to prevent generation of varied defects effectively.

In the embodiments shown above, a passivation film and a polyimide resin film are used for the first protective insulating film and the second protective insulating film respectively. However, they are only examples, not restrictive. Materials such as PSG, BSG, BPSG, SiN can be used as the first protective insulating film if they have protective effect.

Other materials can be used as the second protective insulating film if they have protective and stress releasing effect.

In the semiconductor device according to the embodiments of the present invention, a fuse window opening will not become narrower and fuse blowing is performed stably as there is no gap between side walls of a protective polyimide resin film and a passivation film on a fuse window opening area.

Furthermore, in the first embodiment of manufacturing method of the semiconductor device according to the present invention, the first protective insulating film at an opening of the fuse window, a thin silicon nitride film and an interlayer insulating film are etched simultaneously using a polyimide resin film as a mask. Therefore, it is not required to add one photo lithography step as another process to open a metal fuse window in addition to perform opening of a bonding pad. Thus, the process is simplified and the cost is reduced.

Still further, in the second embodiment of manufacturing method of the semiconductor device according to the present invention, the first protective insulating film and the thin silicon nitride film at an opening of the fuse window are etched when an opening is made for the bonding pad in advance and the interlayer insulating film is etched using polyimide as a mask. Therefore, it is not required to add one photo lithography step to open a metal fuse window in addition to opening a bonding pad. Furthermore, according to this embodiment, depth to be etched is smaller than the first embodiment. Thus, the process is simplified and the cost is reduced.

What is claimed is:

1. A method for manufacturing a semiconductor device, comprising;
    forming elements on a substrate;
    forming stacked interconnection structure on said elements by sequentially forming interlayer insulating film, interconnection layer and antioxidant layer and repeating these forming at least two times;
    forming a first protective insulating film on a top antioxidant layer;
    removing said first protective insulating film and said top antioxidant layer at lead out region of a top interconnection region and fuse blowing region of a top interconnection layer to form a interconnection lead out opening and a fuse blowing opening;
    forming a lead out electrode in said lead out opening;
    forming a second protective insulating film having an opening on said first protective insulating film, said opening corresponding to a said fuse blowing opening; and
    forming a window for fuse blowing by removing a part of said interlayer insulating film using said second protective insulating film as a mask.

2. The method for manufacturing a semiconductor device according to claim 1, wherein said removing is anisotropic etching.

3. The method for manufacturing a semiconductor device according to claim 1 further comprising flattening the first insulating film using the Chemical Mechanical Polishing (CMP) method.

4. The method for manufacturing a semiconductor device according to claim 1 further comprising creating a first contact hole by photolithography.

* * * * *